United States Patent [19]
Blauer et al.

[11] Patent Number: 5,315,171
[45] Date of Patent: May 24, 1994

[54] ANALOG FEEDBACK RANK ORDER FILTER

[76] Inventors: Michael Blauer, 3589 Lorne Ave #3, Montreal, Quebec, Canada, H2X 2A4; Martin D. Levine, 306 Strathearn Ave., Montreal West, Quebec, Canada, H4X 1Y4

[21] Appl. No.: 995,819

[22] Filed: Dec. 23, 1992

[51] Int. Cl.[5] .................. H03K 5/24; H03K 5/153
[52] U.S. Cl. ................................ 307/355; 307/357; 307/359; 307/521
[58] Field of Search .............. 307/355, 356, 354, 359, 307/520, 521, 464, 357; 328/146, 147, 117

[56] References Cited

U.S. PATENT DOCUMENTS

| | | | |
|---|---|---|---|
| 3,667,057 | 5/1972 | Pfersch, Jr. et al. | 307/359 |
| 3,858,199 | 12/1974 | Neuner et al. | 307/357 |
| 3,969,619 | 7/1976 | El-Ramly | 307/357 |
| 4,001,605 | 1/1977 | Thomas et al. | 307/355 |
| 4,017,742 | 4/1977 | James | 328/117 |
| 4,802,108 | 1/1989 | Bagdis et al. | 364/715.01 |

Primary Examiner—John Zazworsky

[57] ABSTRACT

An analog feedback rank order filter electronic circuit for receiving a number N of analog input signals ($V_1$, $V_2$, ..., $V_N$) and reproducing at its output ($V_o$) the magnitude of that one of the input signals having a magnitude which is the $K^{th}$ largest among the magnitudes of the N input signals, K being an adjustable rank parameter in the range of 1 to N, comprising: N comparator subcircuits, a summation subcircuit, an integrator subcircuit and means for generating a control signal whose magnitude selects the desired rank parameter K.

2 Claims, 1 Drawing Sheet

ANALOG FEEDBACK RANK ORDER FILTER

DESCRIPTION OF THE INVENTION

1. Field of Invention

The present invention is an electronic circuit which is implementable via discrete electronic components or any Integrated Circuit (IC) technology.

2. Objects and Advantages

Rank order filters are widely used in signal processing applications due to their superior ability to suppress noise as compared to linear filters. Rank order filters, also known as order statistic filters, involve a ranking or ordering operation of the magnitudes of their inputs. Given N input signals, the corresponding $K^{th}$ rank order output signal is a signal whose magnitude at any given time is equal to the $K^{th}$ largest magnitude among the magnitudes of the N input signals at that given time. Special cases of interest are the maximum signal ($K=1$), the minimum signal ($K=N$) and the median signal ($K=(N+1)/2$, N odd).

The present invention provides a low complexity feedback rank order filter for an arbitrary number of analog input signals which can produce at its output any desired rank order signal. Furthermore, the desired rank K is adjustable during operation via a control signal to any value in the range 1 to N.

The advantages of the present invention include:

a) Analog-to-digital (A/D) and digital-to-analog (D/A) signal conversion is not required.

b) The design is suitable for an arbitrary number of input signals.

c) The complexity in terms of number of circuit elements is small. For N inputs the number of circuit elements is proportional to N.

d) The design is based on a feedback configuration in which the output signal is continuously compared against the appropriately ranked input signal, and any error between the two is continuously and automatically reduced towards zero. Therefore errors between the output and the true rank order signal due to drift in the operating characteristics of circuit elements are minimized.

f) At any given time during operation the circuit may be adjusted, via the magnitude of a control signal, to reproduce at the output any arbitrary rank order signal K in the range of 1 to N.

3. Description of Prior Art

Previous implementations of rank order filters for analog signals suffer from one or more of the following limitations:

a) They employ a digital sorting mechanism which requires analog-to-digital (A/D) and digital-to-analog (D/A) signal conversion.

b) They comprise circuits specialized for a fixed number of input signals, typically three.

c) Their complexity in terms of number of circuit elements is large. For N inputs the number of circuit elements is proportional to $N^2$, due to the need for a number of subcircuits proportional to N, each consisting of a number of elements proportional to N.

d) They are based on an open-loop design in which the appropriately ranked signal at any given time is switched to the output. Such designs may produce large errors between the output and the true rank order signal due to drift in the operating characteristics of circuit elements.

f) They are specialized to one specific rank order signal, for example the maximum or median signal, and are not adjustable during operation to select any arbitrary rank order signal in the range of 1 to N. References to prior art:

1) J. S. J. Li and W. H. Holmes, "Analog implementation of median filters for real-time signal processing" IEEE Trans Circuits Syst., V 35, pp 1032-1033, 1988. In this method the inputs are periodically compared against a saw-tooth reference voltage and the number of level crossings of the inputs by the reference voltage is counted by means of voltage comparators. When the number of crossings is equal to the desired rank order signal the output of the circuit is clamped to the reference voltage until the next scanning period. The output is only a staircase approximation of the desired signal and the method requires timing and sample-and-hold circuitry. It is also specific to the median rank signal and is an open-loop design.

2) B. D. Liu, C. S. Tsay, C. D. Chen, E. H. Lu, and C. S. Laih, "An analog median filter with linear complexity for real-time processing", Proc. 1991 IEEE Int. Symp. on Circuits and Systems, Singapore, pp 2565-2567, June, 1991. This circuit requires for each input four different clock signals, a digital control circuit composed of several logic gates and four analog switches. It also an open-loop design and is specific to the median rank signal.

3) J. Lazzaro, M. A. Mahowald, C. A. Mead and S. Ryckebusch, "Winner-take-all circuits for neural computing systems", U.S. Pat. No. 5,059,814. This patent describes a CMOS circuit which is specialized to the maximum rank order signal.

4) J. F. Brentnall, "Signal Discriminating Apparatus", U.S. Pat. No. 4,583,010. This patent describes a circuit for rank order signal selection. Its complexity is significantly larger than that of the present invention since for N inputs it requires $(N+1)/2$ subcircuits, each of which comprises more than N elements. It is also an open-loop design.

DESCRIPTION OF THE DRAWING FIGURES

FIG. 1 provides a schematic diagram of the analog feedback rank order filter of the present invention. The following reference symbols are used in FIG. 1:

| | |
|---|---|
| $V_1, V_2, \ldots, V_N$ | N analog input signals |
| $C_1, C_2, \ldots, C_N$ | N comparator subcircuits |
| $S_1$ | Summation subcircuit |
| $I_1$ | Integrator subcircuit |
| $G_1$ | Signal generator subcircuit |
| $V_c$ | Control signal |
| $V_e$ | Output signal of summation subcircuit |
| $V_o$ | Rank order filter output |

DETAILED DESCRIPTION

Figure 1:
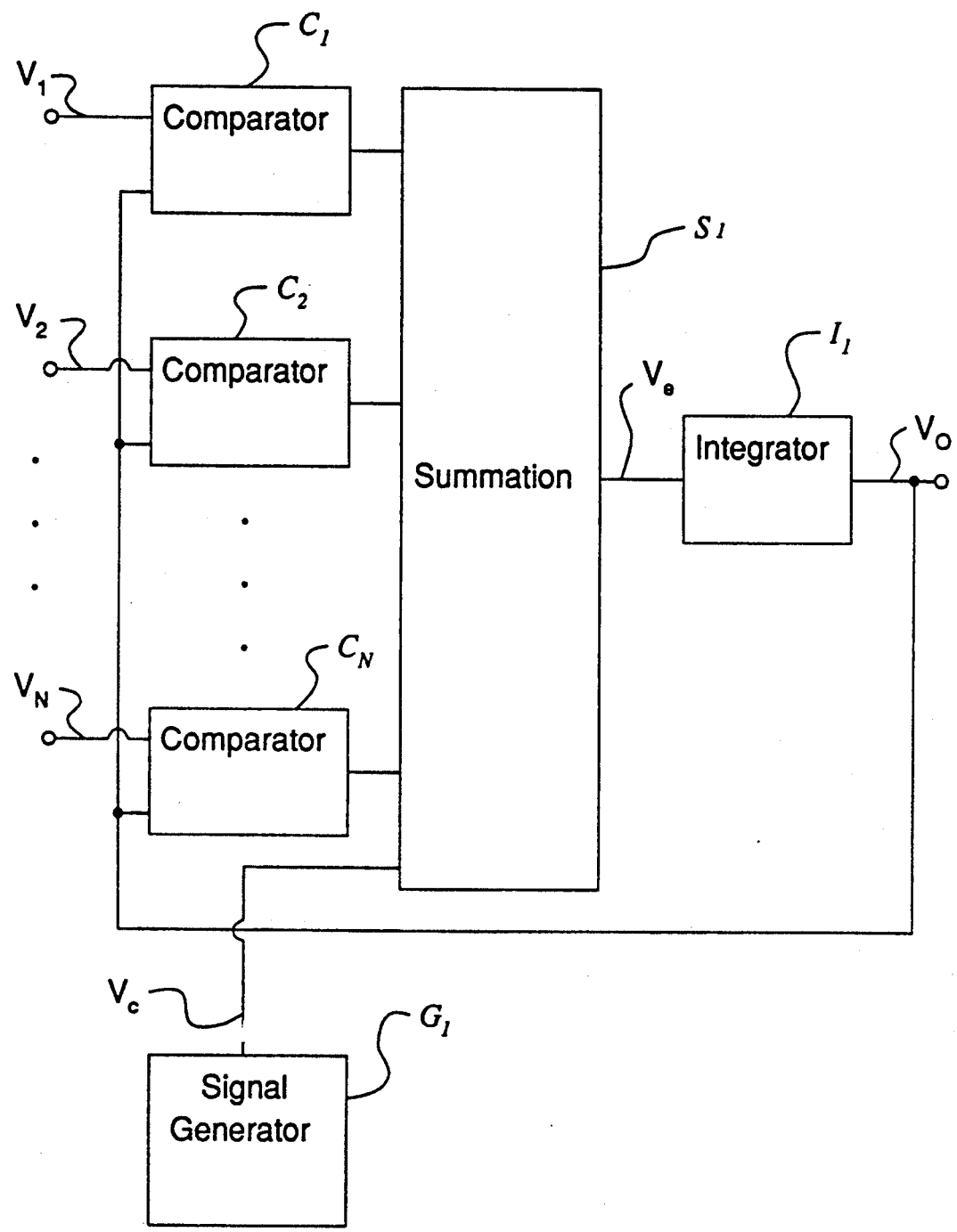

Given a number N of analog input signals and an integer number K in the range of 1 to N, the corresponding rank order signal of rank K is a signal whose magnitude at any given time is equal to the one input among the N input signals whose magnitude at that given time is the $K^{th}$ largest. Alternatively, the rank order signal of rank K is the signal for which, at any given time, K of the N input signals are larger or equal in magnitude, and $N-K$ of the N input signals are smaller or equal in magnitude.

The present invention is an analog feedback rank order filter electronic circuit for receiving an arbitrary number N of analog input signals and continuously reproducing at its output any desirable rank order signal K in the range of 1 to N. The desirable rank parameter K is adjustable via the magnitude of a control signal.

The analog rank order filter circuit is described in FIG. 1. It is composed of the following components:

a) N analog input signals ($V_1, V_2, \ldots, V_N$);

b) N comparator subcircuits ($C_1, C_2, \ldots, C_N$), each having a first input and a second input and an output. Each comparator forms at its output a signal whose magnitude has a predetermined positive value X whenever the magnitude of its first input is larger than the magnitude of its second input, and a predetermined negative value Y whenever the magnitude of its first input is smaller than the magnitude of its second input;

c) A summation subcircuit ($S_1$) having $N+1$ inputs and an output and which forms at its output a signal whose value is approximately the sum of the values of its inputs;

d) An integrator subcircuit ($I_1$) having an input and an output and which forms at its output a signal whose magnitude is approximately the integral with respect to time of its input. The output of the integrator also coincides with the output of the filter ($V_o$);

e) A control signal generator ($G_1$) subcircuit having an output ($V_c$) and which is adjustable to generate a signal whose magnitude is $$V_c = (1-K)X + (K-N)Y$$

where X and Y are the two output levels of the comparators described above and K is an integer parameter in the range of 1 to N corresponding to the desired rank of the signal to be reproduced. By changing the value of the output ($V_c$) as a function of K via the above formula, the signal generator is used to adjust the operation of circuit to reproduce any desired rank order signal in the range of 1 to N.

The above elements are interconnected as follows: The input signals ($V_1, V_2, \ldots, V_N$) are each connected to the first input of one of the N comparators ($C_1, C_2, \ldots, C_N$). The outputs of the comparators and control signal ($V_c$) are connected to the $N+1$ inputs of the summation subcircuit ($S_1$). The output signal ($V_e$) of the summation subcircuit is connected to the input of integrator subcircuit ($I_1$). The output ($V_o$) of the integrator subcircuit is connected to the second input of each of the comparators ($C_1, C_2, \ldots, C_N$).

The circuit operates as follows:

The output ($V_o$) is fed back and compared to each of the N inputs by means of the N comparators. The N comparators ($C_1, C_2, \ldots, C_N$) output a positive signal of magnitude X whenever their corresponding input signals ($V_1, V_2, \ldots, V_N$) are larger than the output ($V_o$) and a negative signal of magnitude Y otherwise. The summation subcircuit ($S_1$) sums the outputs of the comparators together with the control signal ($V_c$), whose magnitude as a function of the desired rank K is $(1-K)X+(K-N)Y$, and produces this sum as its output signal ($V_e$).

Whenever the output signal ($V_o$) is larger than K of the N input signals, then: no more than $K-1$ of the comparators will output the positive value X, and at least $N-K+1$ of the comparators will output the negative value Y. Thus the sum of the comparator outputs with the control signal ($V_c$), whose value is $(1-K)X+(K-N)Y$ will be negative.

Conversely, whenever the output signal ($V_o$) is smaller than K of the N input signals, then: at least K of the comparators will output the positive value X, and no more than $N-K$ of the comparators will output the negative value Y. Thus the sum of the comparator outputs with the control signal ($V_c$), whose value is $(1-K)X+(K-N)Y$, will be positive.

Therefore, at all times the polarity of the error signal ($V_e$) at the output of the summation subcircuit will be the same as the polarity of the error between the $K^{th}$ largest input signal among the signals ($V_1, V_2, \ldots, V_N$) and the output ($V_o$). The integrator ($I_1$) integrates the error signal ($V_e$) and, depending on its polarity, will automatically increase or decrease the value of the output ($V_o$) as appropriate to continuously reduce the error signal ($V_e$) towards zero.

The operation of the circuit is similar to a feedback regulator which tracks a given input signal. In our case the implicit reference signal is the $K^{th}$ rank order signal of the inputs ($V_1, V_2, \ldots, V_N$).

A second version of the analog feedback rank order filter is also included in the present invention. This version is identical to that described above, except for the omission of the integrator ($I_1$) which is replaced by a direct connection between the summation subcircuit output to the circuit output ($V_o$). This version is motivated by the fact that in many cases circuit elements may contain associated stray capacitance and would therefore implicitly perform the required integration function.

We claim:

1. An analog feedback rank order filter electronic circuit for receiving a number N of analog input signals ($V_1, V_2, \ldots, V_N$) and reproducing at its output ($V_o$) the magnitude of that one of said input signals having a magnitude which is $K^{th}$ largest among the magnitudes of said N input signals, K being an adjustable rank parameter number in the range of 1 to N, comprising:

means for receiving said N analog input signals ($V_1, V_2, \ldots, V_N$);

N comparator means subcircuits ($C_1, C_2, \ldots, C_N$), each having a first input and a second input and an output and being operable to form at its output a signal having a positive magnitude X whenever the magnitude of its first input is larger than the magnitude of its second input, and a negative magnitude Y whenever the magnitude of its first input is smaller than the magnitude of its second input;

a summation means subcircuit ($S_1$) having a number $N+1$ of inputs and an output and being operable to form at its output a signal whose magnitude is approximately the sum of the magnitudes of its inputs;

an integrator means subcircuit ($I_1$) having an input and an output and being operable to form at its output a signal whose magnitude is approximately the integral with respect to time of its input;

an analog rank signal output being supplied by the output ($V_o$) of said integrator subcircuit;

a control signal generator means subcircuit having an output ($V_c$) and being operable to form at its output a signal whose magnitude is approximately $(1-K)X+(K-N)Y$, K being said adjustable rank parameter, whereby causing the $K^{th}$ rank order signal to be reproduced at the output ($V_o$);

said N input signals being each connected to the first input of one and only one of said N comparator subcircuits, the outputs of said N comparator subcircuits and the output ($V_c$) of said control signal generator being each connected to one and only one of the N+1 inputs of said summation subcircuit, the output of said summation subcircuit being connected to the input of said integrator subcircuit and the output of said integrator subcircuit ($V_o$) being connected to the second input of each of said N comparator subcircuits.

2. The electronic circuit of claim 1 wherein said integrator subcircuit ($I_1$) is omitted and the output ($V_e$) of said summation subcircuit, now supplying said rank signal output, being connected to the second input of each of said N comparator subcircuits.

* * * * *